(12) United States Patent
Ali

(10) Patent No.: US 9,337,292 B1
(45) Date of Patent: May 10, 2016

(54) VERY HIGH ASPECT RATIO CONTACT

(71) Applicant: Texas Instruments Incorporated, Dallas, TX (US)

(72) Inventor: Abbas Ali, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/555,359

(22) Filed: Nov. 26, 2014

(51) Int. Cl.
| H01L 23/52 | (2006.01) |
| H01L 29/45 | (2006.01) |
| H01L 29/41 | (2006.01) |
| H01L 29/06 | (2006.01) |
| H01L 21/02 | (2006.01) |
| H01L 21/265 | (2006.01) |
| H01L 21/311 | (2006.01) |

(52) U.S. Cl.
CPC .......... *H01L 29/45* (2013.01); *H01L 21/02164* (2013.01); *H01L 21/02271* (2013.01); *H01L 21/02532* (2013.01); *H01L 21/02595* (2013.01); *H01L 21/26513* (2013.01); *H01L 21/31116* (2013.01); *H01L 29/0684* (2013.01); *H01L 29/0692* (2013.01); *H01L 29/41* (2013.01)

(58) Field of Classification Search
CPC ...................... H01L 27/10829; H01L 29/0653; H01L 29/45; H01L 21/02164; H01L 21/02271; H01L 21/02532; H01L 21/02595; H01L 21/26513; H01L 21/31116; H01L 29/0684; H01L 29/0692; H01L 29/41
USPC .......................................... 257/301; 438/386
See application file for complete search history.

(56) References Cited

U.S. PATENT DOCUMENTS

| 2009/0176375 | A1* | 7/2009 | Benson et al. ................. 438/719 |
| 2010/0240191 | A1* | 9/2010 | Chung et al. ................... 438/386 |
| 2010/0319962 | A1* | 12/2010 | Clevenger et al. .......... 174/126.4 |
| 2013/0134491 | A1* | 5/2013 | Messenger et al. ............ 257/301 |
| 2014/0110374 | A1* | 4/2014 | Brencher et al. ................. 216/67 |

* cited by examiner

*Primary Examiner* — Fernando L Toledo
*Assistant Examiner* — Neil Prasad
(74) *Attorney, Agent, or Firm* — Jacqueline J. Garner; Frank D. Cimino

(57) ABSTRACT

A semiconductor device with a very high aspect ratio contact has a deep trench in the substrate. A dielectric liner is formed on sidewalls and a bottom of the deep trench. A contact opening is formed through the dielectric liner at the bottom of the deep trench to expose the substrate, leaving the dielectric liner on the sidewalls. Electrically conductive material is formed in the deep trench to provide the very high aspect ratio contact to the substrate through the contact opening.

22 Claims, 11 Drawing Sheets

VERY HIGH ASPECT RATIO CONTACT

FIELD OF THE INVENTION

This invention relates to the field of semiconductor devices. More particularly, this invention relates to deep trench structures in semiconductor devices.

BACKGROUND OF THE INVENTION

A semiconductor device has an electrical connection from a top surface to the substrate below a buried layer. The electrical connection undesirably requires significant space and extra photolithographic process steps, both of which disadvantageously increase fabrication cost and complexity of the semiconductor device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device is formed on a substrate comprising a semiconductor. A deep trench is formed in the substrate and a dielectric liner is formed on sidewalls and a bottom of the deep trench. A contact opening is formed through the dielectric liner at the bottom of the deep trench to expose the substrate. Conductive material is formed in the deep trench to provide a very high aspect ratio contact to the substrate through the contact opening.

DETAILED DESCRIPTION OF EXAMPLE EMBODIMENTS

The following co-pending patent applications are related and hereby incorporated by reference: U.S. patent application Ser. No. 14/555,209, U.S. patent application Ser. No. 14/555,300, and U.S. patent application Ser. No. 14/555,330, all filed simultaneously with this application).

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
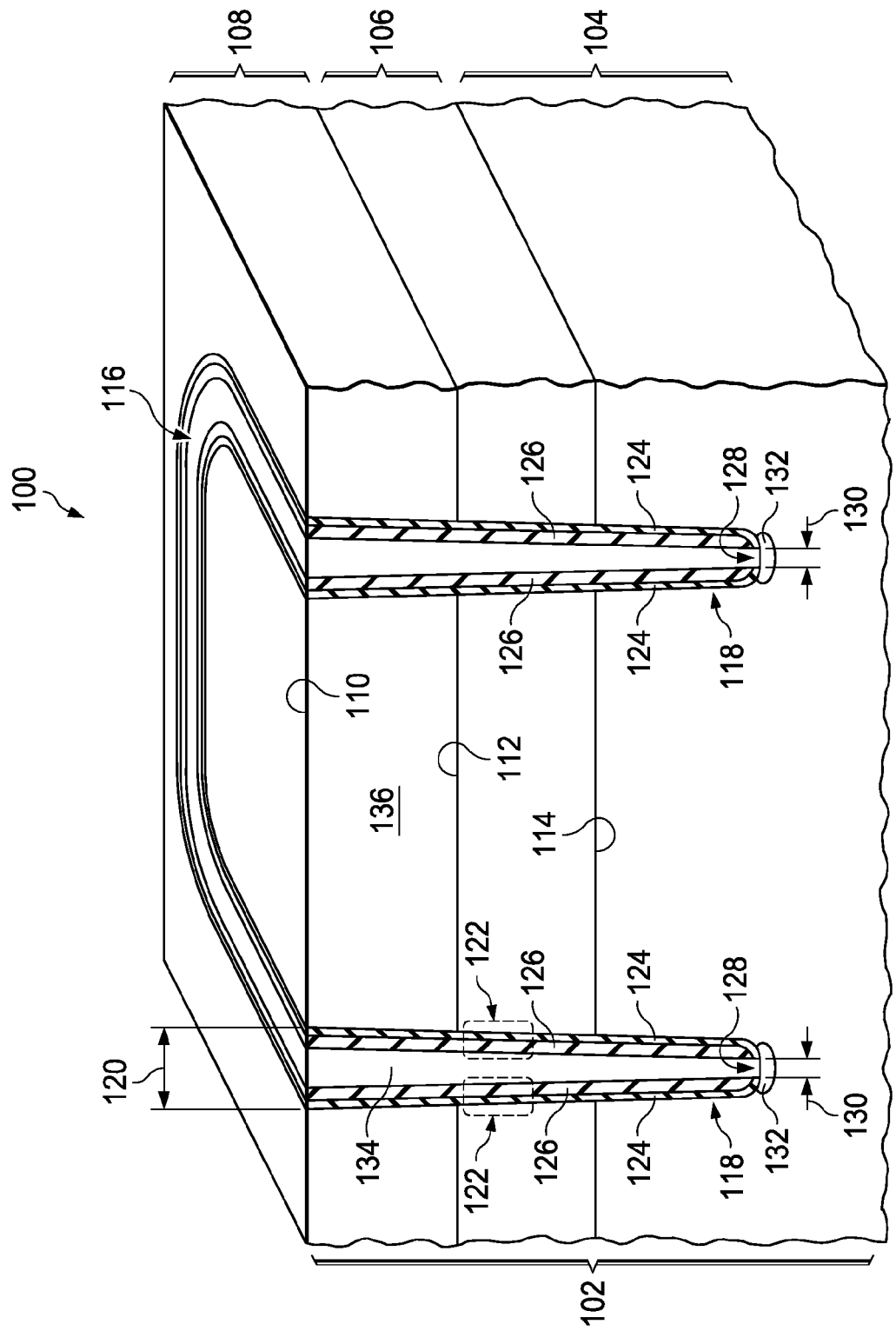
FIG. 1 is a cross section of an example semiconductor device containing a very high aspect ratio contact.

FIG. 1 is a cross section of an example semiconductor device containing a very high aspect ratio contact. The semiconductor device 100 is formed on a substrate 102 comprising a base layer 104. The base layer 104 may be, for example, p-type bulk silicon or p-type epitaxial silicon over bulk silicon. An n-type buried layer 106 may be disposed in the substrate 102 over the base layer 104. A p-type upper layer 108 may be disposed in the substrate 102 above the buried layer 106 and extending to a top surface 110 of the substrate 102. A top surface 112 of the buried layer 106 may be 5 microns to 15 microns below the top surface 110 of the substrate 102, and a bottom surface 114 of the buried layer 106 may be 5 microns to 15 microns below the top surface 112 of the buried layer 106. The buried layer 106 may extend substantially across the semiconductor device 100 as depicted in FIG. 1 or may be a localized buried layer 106.

A very high aspect ratio contact 116 is disposed in the substrate 102. The very high aspect ratio contact 116 includes a deep trench 118 which extends at least 10 microns deep in the substrate 102. The deep trench 118 extends through the buried layer 106 and into the base layer 104. The deep trench 118 may have a width 120 of 1.5 microns to 5 microns proximate to the top surface 110 of the substrate 102. A dielectric liner 122 is disposed on sidewalls of the deep trench 118. The dielectric liner 122 may have a thickness of 250 nanometers to 750 nanometers. In the instant example, the dielectric liner 122 includes a first dielectric sub-layer 124 on the sidewalls and a second dielectric sub-layer 126 on the first dielectric sub-layer 124. The first dielectric sub-layer 124 may be, for example, a layer of thermal oxide 124 200 nanometers to 300 nanometers thick. The second dielectric sub-layer 126 may be, for example, 300 nanometers to 500 nanometers of deposited silicon dioxide.

The dielectric liner 122 is removed at a bottom of the deep trench 118 in a contact opening 128 which exposes the substrate 102. The contact opening 128 has a width 130 of 200 nanometers to 1 micron. A doped contact region 132 may optionally be disposed in the substrate 102 under the contact opening 128. The doped contact region 132 is doped with a same polarity of dopants as the base layer 104 and may have an average doping density greater than $1 \times 10^{19}$ cm$^{-3}$. A deep trench contact material 134 which is electrically conductive is disposed in the very high aspect ratio contact 116 on the dielectric liner 122, extending through the contact opening 128 and making an electrical connection to the substrate 102, through the doped contact region 132 if present. The deep trench contact material 134 may be predominantly polycrystalline silicon, referred to as polysilicon, or may be other electrically conductive material such as a layer of titanium and/or a layer of titanium nitride and a fill layer of tungsten or aluminum. The very high aspect ratio contact 116 may have an aspect ratio, that is, a ratio of the depth of the deep trench 118 to the width 120, greater than 20. The very high aspect ratio contact 116 advantageously consumes less area of the semiconductor device 100 compared to other deep contacts.

In the instant example, the very high aspect ratio contact 116 has a closed-loop configuration as depicted in FIG. 1, so that a portion 136 of the upper layer 108 is electrically isolated from the remaining upper layer 108 by the very high aspect ratio contact 116. In another version of the instant example, the very high aspect ratio contact 116 may have a linear configuration rather than a closed-loop configuration. In an alternate version of the instant example, the semiconductor device 100 may be formed on an n-type base layer 104 with a p-type buried layer 106 and an n-type upper layer 108.

Figure 2A:
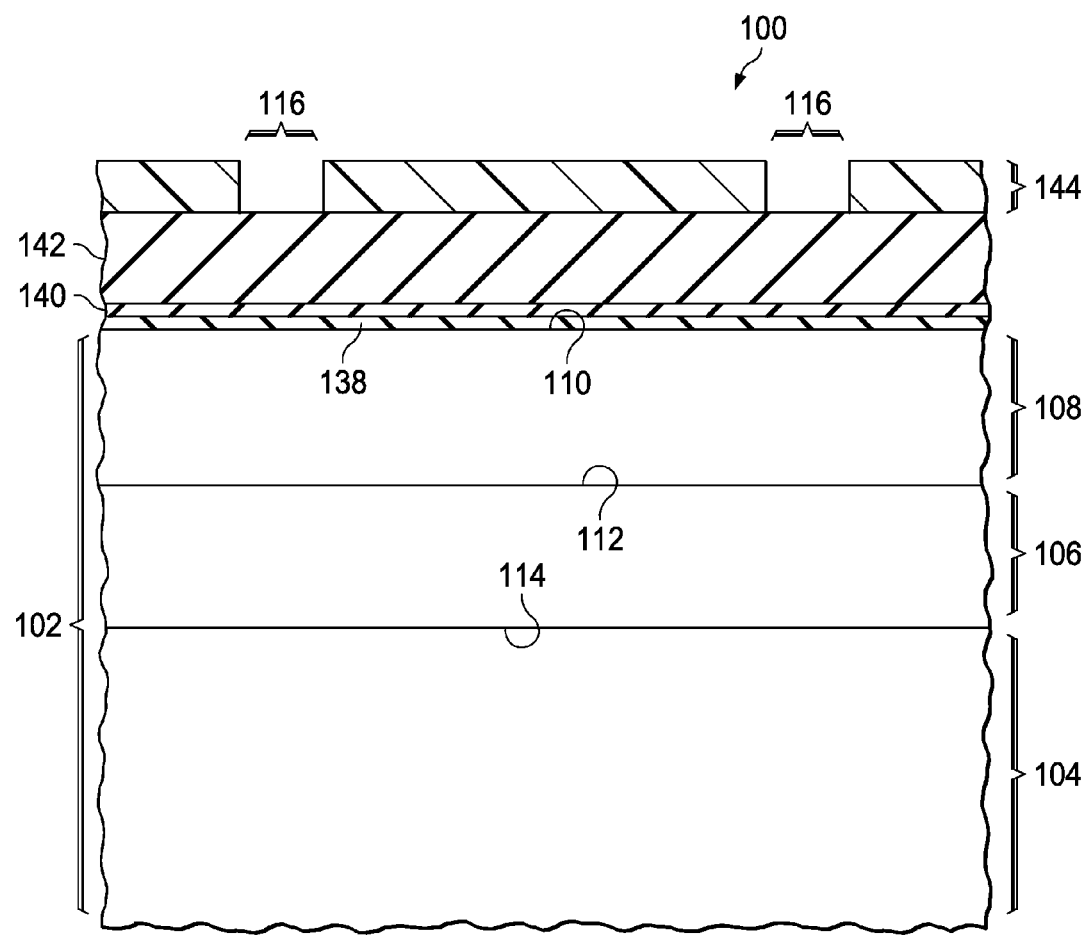
FIG. 2A through FIG. 2H are cross sections of the semiconductor device of FIG. 1, depicted in successive stages of fabrication.

FIG. 2A through FIG. 2H are cross sections of the semiconductor device of FIG. 1, depicted in successive stages of fabrication. Referring to FIG. 2A, the buried layer 106 and the upper layer 108 are formed on the base layer 104. The buried layer 106 may be formed by implanting n-type dopants into the p-type base layer 104, followed by a thermal drive anneal and a subsequent epitaxial process to grow the p-type upper layer 108, so that the buried layer 106 is formed by diffusion and activation of the implanted n-type dopants.

A layer of pad oxide 138 is formed at the top surface 110 of the substrate, for example by thermal oxidation. The layer of pad oxide 138 may include 5 nanometers to 30 nanometers of silicon dioxide. A layer of pad nitride 140 is formed on the layer of pad oxide 138, for example by low pressure chemical vapor deposition (LPCVD) using ammonia and silane. The layer of pad nitride 140 may include 100 nanometers to 300 nanometers of silicon nitride. A layer of hard mask oxide 142 is formed over the layer of pad nitride 140, for example by a plasma enhanced chemical vapor deposition (PECVD) using tetraethyl orthosilicate, also called tetraethoxysilane (TEOS), or using a high density plasma (HDP) process. The layer of hard mask oxide 142 may include 500 nanometers to 2 microns of silicon dioxide. The layer of pad nitride 140 provides an etch stop layer for subsequent etching of the layer of hard mask oxide 142.

A trench mask 144 is formed over the layer of hard mask oxide 142 so as to expose areas for the very high aspect ratio contact 116 of FIG. 1. The trench mask 144 may include photoresist formed by a photolithographic process, and may further include a hard mask layer and/or an anti-reflection layer.

Figure 2B:
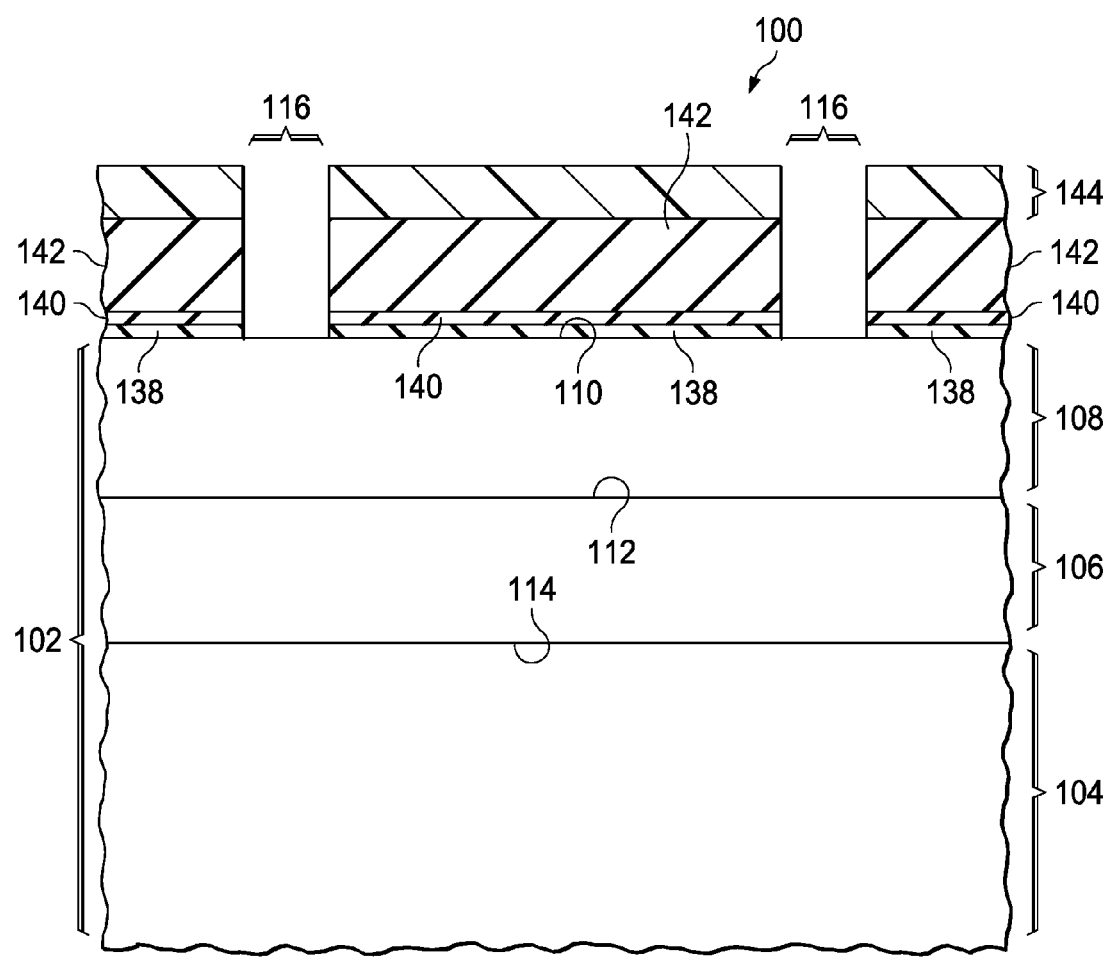

Referring to FIG. 2B, a hard mask etch process removes material from the layer of hard mask oxide 142 in the areas exposed by the trench mask 144. Subsequently, a stop layer etch process removes the layer of pad nitride 140 and the layer of pad oxide 138 in the areas exposed by the trench mask 144. The trench mask 144 may be significantly eroded by the hard mask etch process.

Figure 2C:
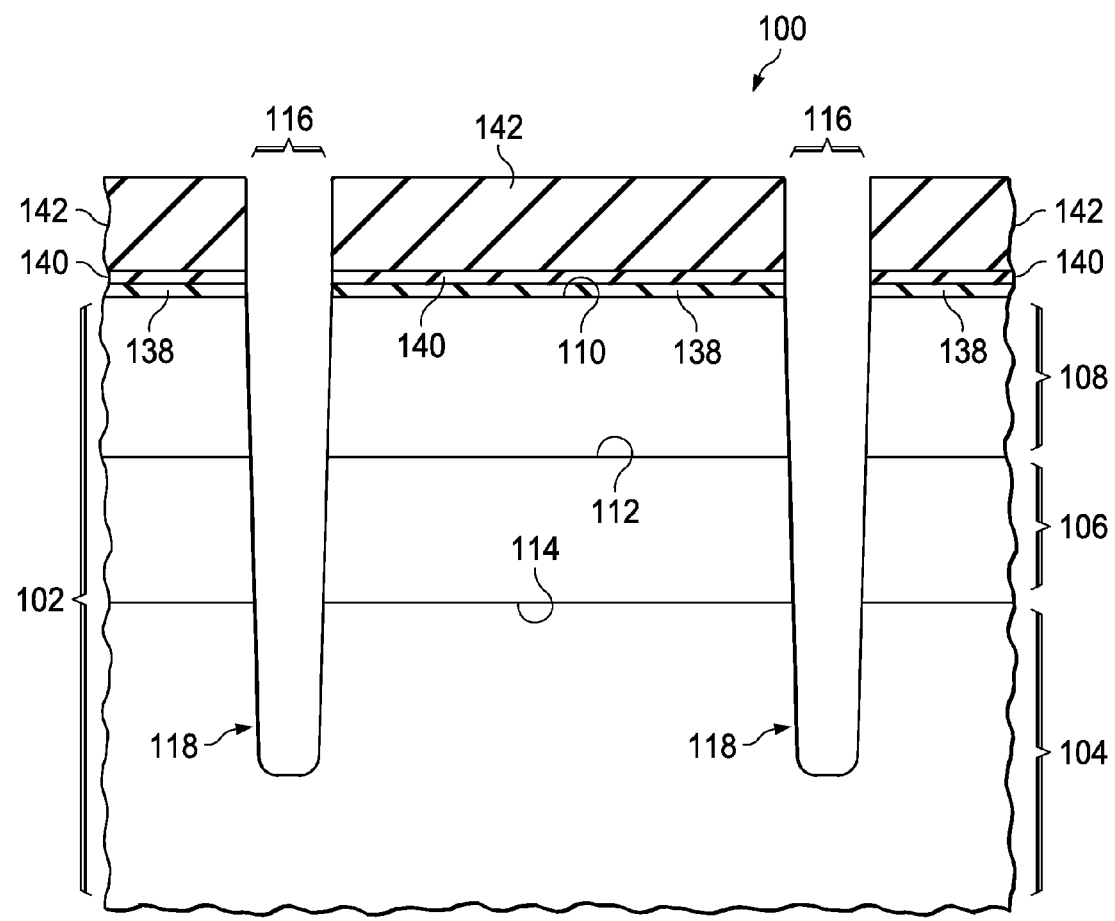

Referring to FIG. 2C, a trench etch process removes material from the substrate 102 in the areas exposed by the layer of hard mask oxide 142 to form the deep trenches 118 which extend to below the bottom surface of the buried layer 106. The deep trenches 118 may be, for example, 25 microns to 35 microns deep in the substrate 102. The trench mask 144 of FIG. 2B may be eroded or substantially removed by the trench etch process, as depicted in FIG. 2C. A portion of the layer of hard mask oxide 142 may also be eroded by the trench etch process. Any remaining trench mask 144 is removed after the deep trenches 118 are formed.

Figure 2D:
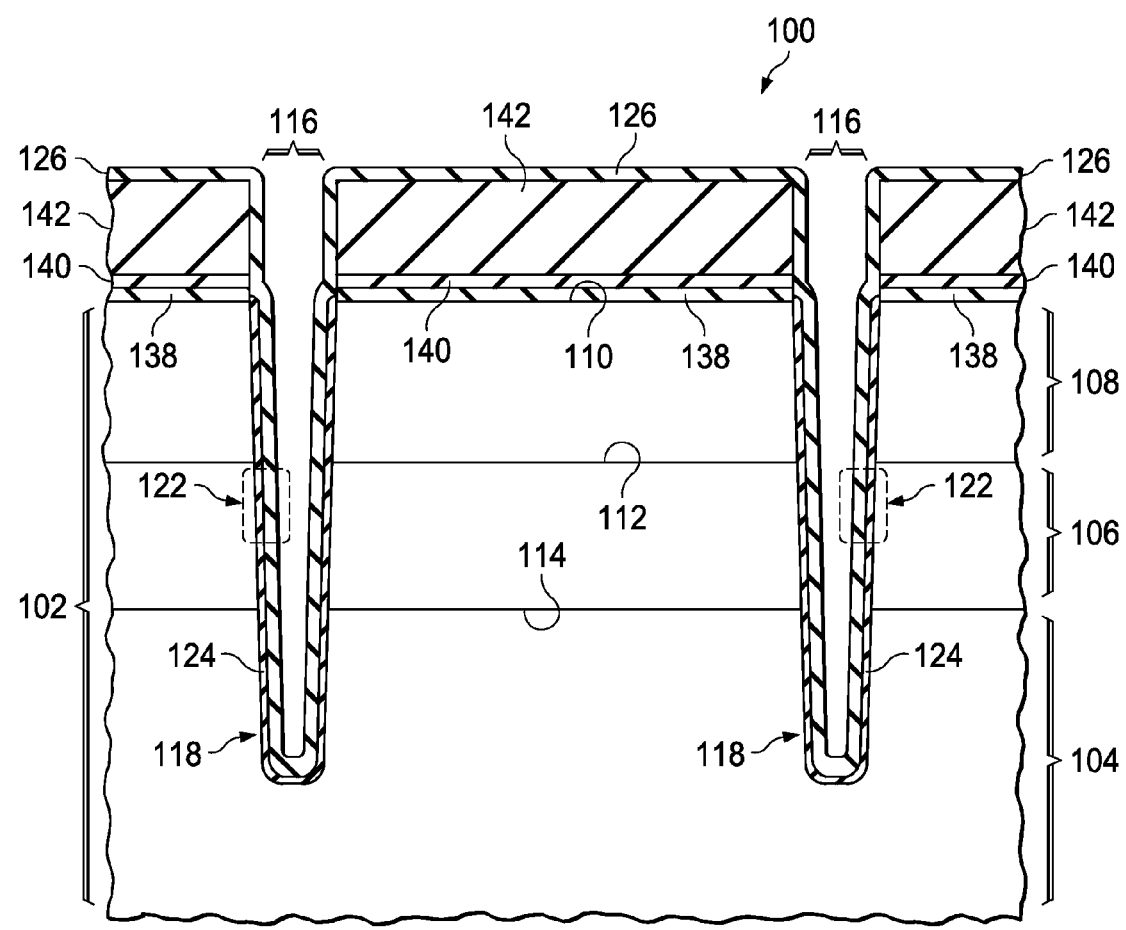

Referring to FIG. 2D, a layer of thermal oxide 124 is formed on the sidewalls and bottoms of the deep trenches 118 to provide the first dielectric sub-layer 124 of the dielectric liner 122. The layer of thermal oxide 124 may be, for example, 200 nanometers to 300 nanometers thick. A layer of silicon dioxide 126 is formed on the layer of thermal oxide 124, for example by a sub-atmospheric chemical vapor deposition (SACVD) process. The layer of silicon dioxide 126 may be, for example, 300 nanometers to 500 nanometers thick. The layer of thermal oxide 124 combined with the layer of deposited silicon dioxide 126 provide the dielectric liner 122.

Figure 2E:
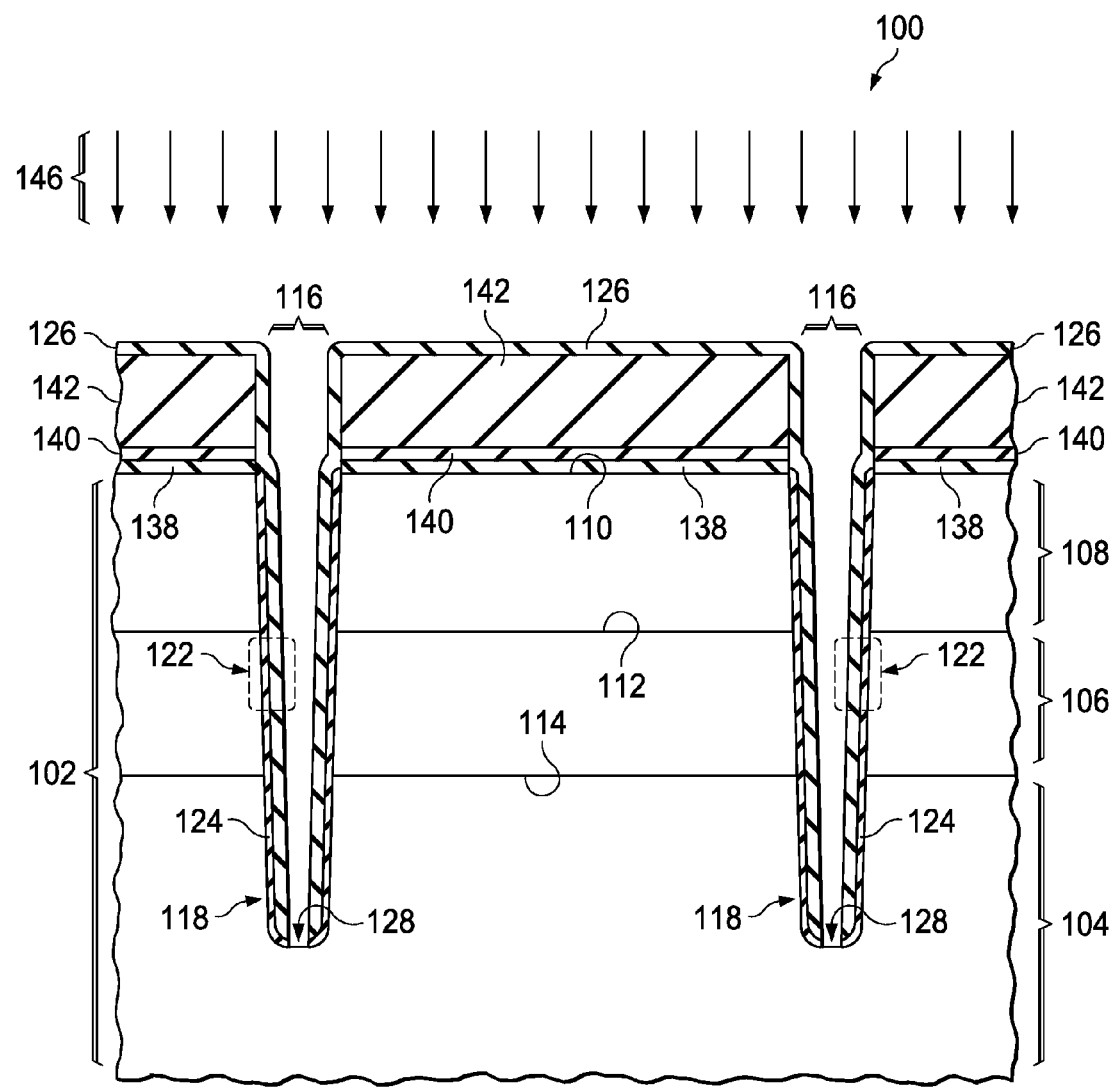

Referring to FIG. 2E, the dielectric liner 122 is removed at bottoms of the deep trenches 118 so as to form the contact openings 128 and expose the base layer 104. The dielectric material may be removed, for example, by a reactive ion etch (RIE) process 146. The RIE process 146 may use a fluorocarbon with at least 4 carbon atoms, such as $C_4F_8$, and oxygen ($O_2$), which forms a carbon-based polymer coating on the dielectric liner 122 on the sidewalls to reduce etching there and so leave the dielectric liner 122 on the sidewalls substantially intact. Using the fluorocarbon with at least 4 carbon atoms and oxygen, with substantially no shorter chain hydrocarbon reactants, advantageously enables forming the contact openings 128 in the deep trench 118 with an aspect ratio of greater than 20. The semiconductor device 100 is free of an etch mask containing photoresist while the contact openings 128 are formed, advantageously reducing fabrication cost and complexity of the semiconductor device 100.

Figure 2F:
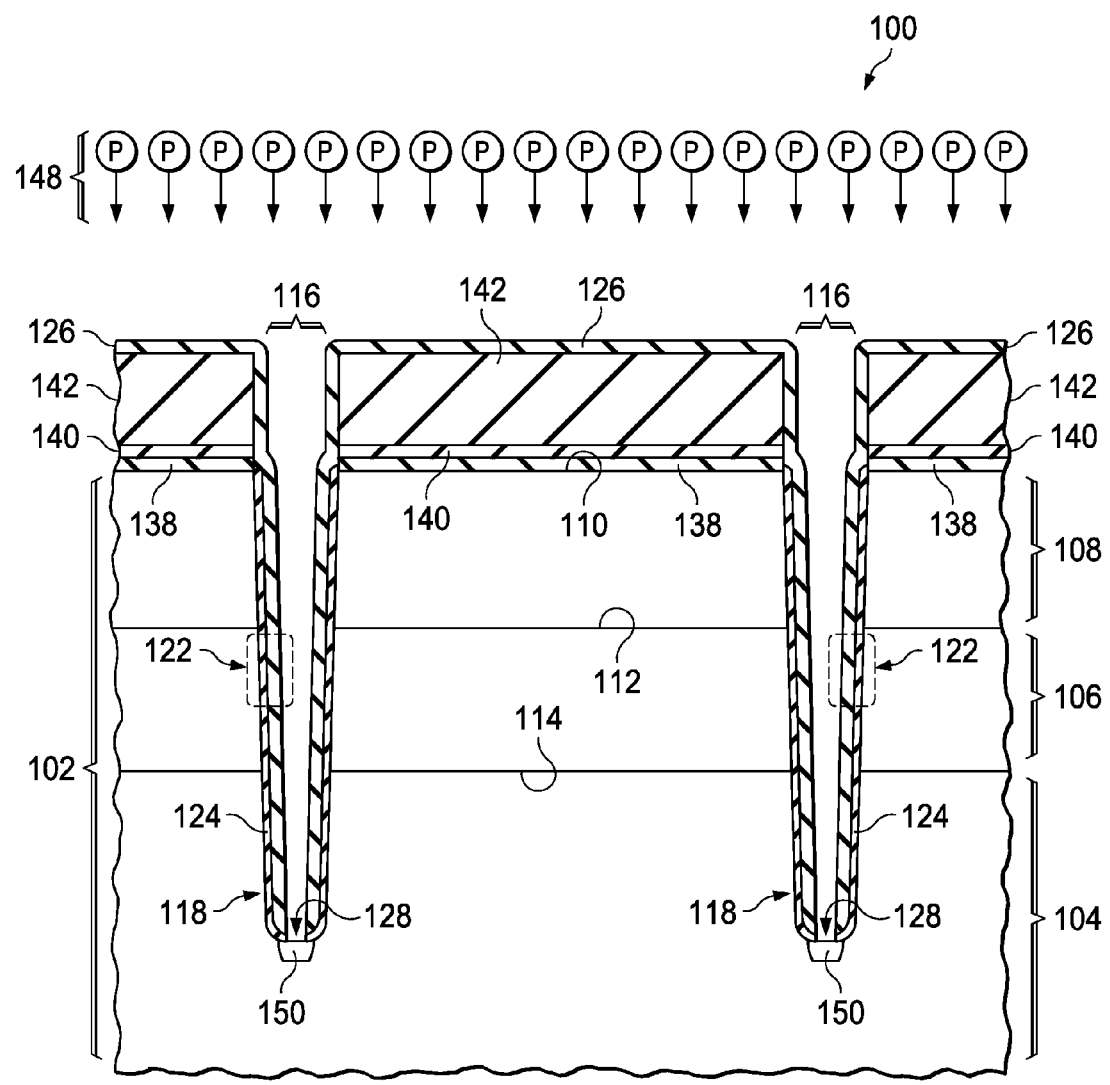

Referring to FIG. 2F, p-type dopants 148 such as boron may be implanted into the substrate 102 under the contact openings 128 to form contact implanted regions 150. The dopants 148 have the same polarity as the dopants in the base layer 104. In the alternate version of the instant example in which the base layer 104 is n-type, the dopants 148 are n-type dopants such as phosphorus and/or arsenic. The dopants 148 may be implanted at a dose of, for example, $2 \times 10^{14}$ cm$^{-2}$ to $2 \times 10^{15}$ cm$^{-2}$. The dopants 148 may be implanted at substantially zero degrees tilt so as to reduce a portion of the dopants 148 which are unavoidably implanted into the dielectric liner 122. The layer of hard mask oxide 142 absorbs the dopants 148 outside the areas for the very high aspect ratio contacts 116. No implant mask generated by a photolithographic process is needed to screen the dopants 148 from the top surface 110 of the substrate 102, advantageously reducing fabrication cost and complexity of the semiconductor device 100.

Figure 2G:
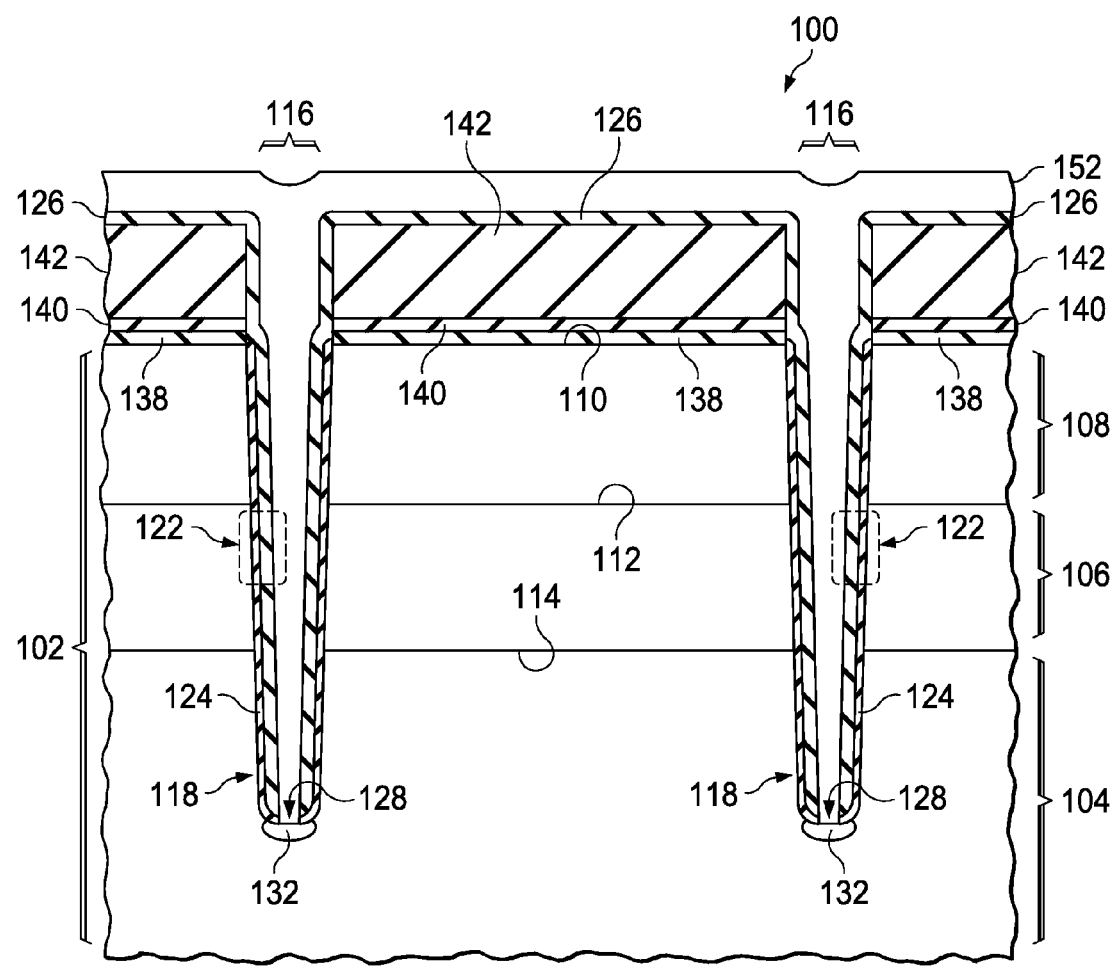

Referring to FIG. 2G, a layer of deep trench contact material 152 is formed over the semiconductor device 100, extending into the deep trenches 118 on the dielectric liner 122 and through the contact openings 128 to make electrical connection to the substrate 102. The dopants in the contact implanted regions 150 of FIG. 2F if present are activated, possibly by the formation of the layer of deep trench contact material 152, to form the doped contact regions 132, so that the layer of deep trench contact material 152 makes electrical connection to the substrate 102 through the doped contact regions 132. In one version of the instant embodiment, the layer of deep trench contact material 152 may be predominantly polysilicon. In another version, the layer of deep trench contact material 152 may include sub-layers with metallic compositions, such as a layer of sputtered titanium and/or a layer of titanium nitride. The layer of deep trench contact material 152 may include an aluminum or tungsten fill metal.

Figure 2H:
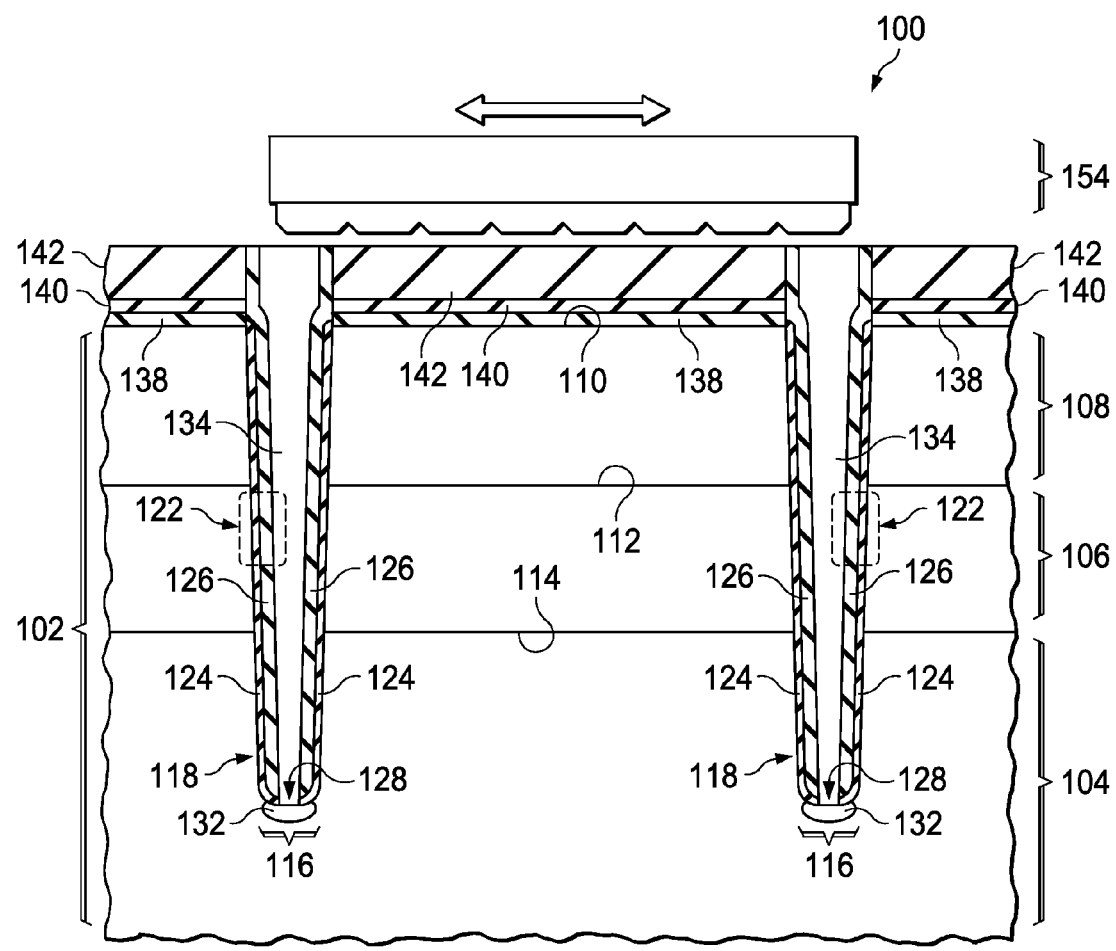

Referring to FIG. 2H, the layer of deep trench contact material 152 of FIG. 2G, the layer of hard mask oxide 142, and a portion of the layer of pad nitride 140 over the top surface 110 of the substrate 102 are removed using a chemical mechanical polish (CMP) process 154 depicted in FIG. 2H as a CMP pad 154. The layer of deep trench contact material 152 remaining in the deep trenches 118 provides the deep trench contact material 134. The remaining layer of pad nitride 140, and the layer of pad oxide 138 are subsequently removed to provide the structure of FIG. 1. Alternatively, the layer of pad oxide 138 may be left in place during subsequent implants and anneals, and removed later in the fabrication process.

Figure 3:
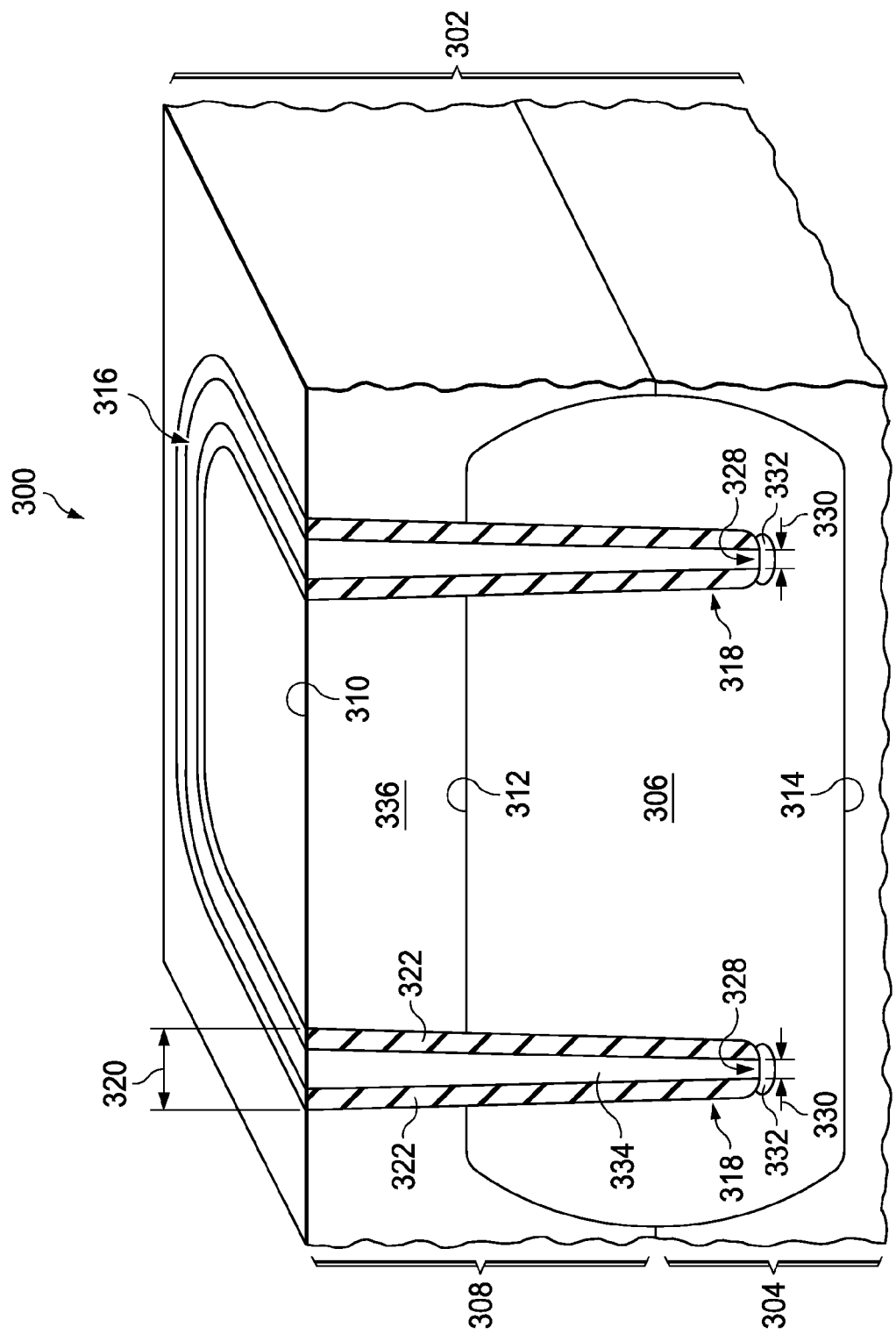
FIG. 3 is a cross section of another example semiconductor device containing a very high aspect ratio contact.

FIG. 3 is a cross section of another example semiconductor device containing a very high aspect ratio contact. The semiconductor device 300 is formed on a substrate 302 comprising a base layer 304. The base layer 304 may be, for example, p-type epitaxial silicon over bulk silicon. A p-type upper layer 308 is disposed in the substrate 302 above the base layer 304 and extending to a top surface 310 of the substrate 302. A localized n-type buried layer 306 is disposed in the substrate 302 over a portion of the base layer 304 and under the upper layer 308. The localized n-type buried layer 306 may be formed by implanting n-type dopants using an implant mask into the p-type base layer 304, followed by a thermal drive anneal and a subsequent epitaxial process to grow the p-type upper layer 308, so that the localized buried layer 306 is formed by diffusion and activation of the implanted n-type dopants. A top surface 312 of the buried layer 306 may be 10 microns to 40 microns below the top surface 310 of the substrate 302, and a bottom surface 314 of the buried layer 306 may be 20 microns to 40 microns below the top surface 312 of the buried layer 306.

A very high aspect ratio contact 316 is disposed in the substrate 302. The very high aspect ratio contact 316 includes a deep trench 318 which extends at least 10 microns deep in the substrate 302. The deep trench 318 extends into the localized buried layer 306 but not into the base layer 304. The deep trench 318 may have a width 320 of 1.5 microns to 5 microns proximate to the top surface 310 of the substrate 302. A dielectric liner 322 is disposed on sidewalls of the deep trench 318. The dielectric liner 322 may have a thickness of 250 nanometers to 750 nanometers. The dielectric liner 316 may be formed as described in reference to FIG. 2D. The dielectric liner 322 is removed at a bottom of the deep trench 318 in a contact opening 328 which exposes the substrate 302, as described in reference to FIG. 2E. The contact opening 328 has a width 330 of 200 nanometers to 1 micron. A doped contact region 332 may optionally be disposed in the substrate 302 under the contact opening 328. The doped contact region 332 is doped with a same polarity of dopants as the localized buried layer 306 and may have an average doping density greater than $1 \times 10^{19}$ cm$^{-3}$. A deep trench contact material 334 which is electrically conductive is disposed in the very high aspect ratio contact 316 on the dielectric liner 322, extending through the contact opening 328 and making an electrical connection to the localized buried layer 306 portion of the substrate 302, through the doped contact region 332 if present. The deep trench contact material 334 may have a composition as described in reference to FIG. 1. The very high aspect ratio contact 316 may have an aspect ratio, that is, a ratio of the depth of the deep trench 318 to the width 320, greater than 20. The very high aspect ratio contact 316 advantageously consumes less area of the semiconductor device 300 compared to other deep contacts.

In the instant example, the very high aspect ratio contact 316 has a closed-loop configuration as depicted in FIG. 3, so that a portion 336 of the upper layer 308 is electrically isolated from the remaining upper layer 308 by the very high aspect ratio contact 316. In another version of the instant example, the very high aspect ratio contact 316 may have a linear configuration rather than a closed-loop configuration, so as to provide a bias connection to the localized buried layer 306. In an alternate version of the instant example, the semiconductor device 300 may be formed on an n-type base layer 304 with a p-type buried layer 306 and an n-type upper layer 308.

Figure 4:
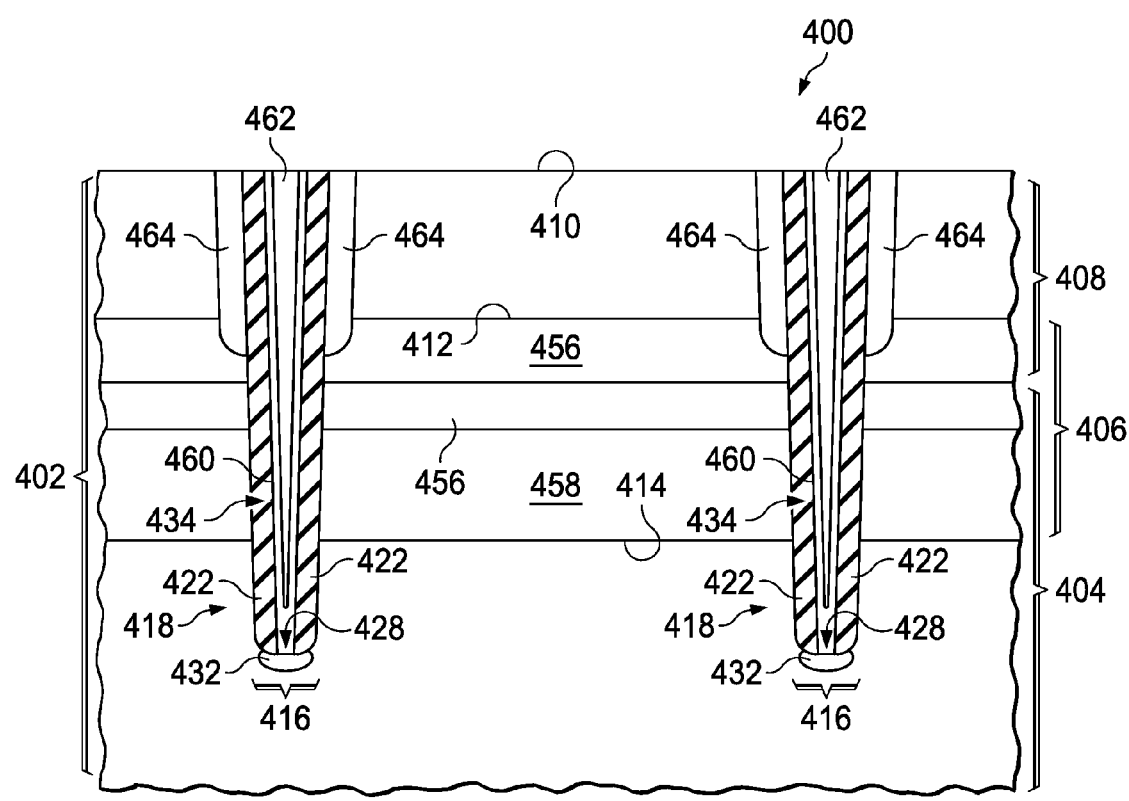
FIG. 4 is a cross section of an example semiconductor device containing a very high aspect ratio contact.

FIG. 4 is a cross section of an example semiconductor device containing a very high aspect ratio contact. The semiconductor device 400 is formed in a substrate 402 comprising a p-type base semiconductor layer 404 of semiconductor material, an n-type buried layer 406 of semiconductor material and a p-type upper semiconductor layer 408 extending to a top surface 410 of the substrate 402. The p-type base semiconductor layer 404 may be an epitaxial semiconductor layer with a resistivity of 5 ohm-cm to 10 ohm-cm. The p-type upper semiconductor layer 408 may also be an epitaxial semiconductor layer with a resistivity of 5 ohm-cm to 10 ohm-cm. The n-type buried layer 406 may include a main layer 456 which straddles the boundary between the base semiconductor layer 404 and the upper semiconductor layer 408, extending at least a micron into the base semiconductor layer 404 and at least a micron into the upper semiconductor layer 408. The n-type buried layer 406 may also include a lightly-doped layer 458 extending at least 2 microns below the main layer 456. A top surface 412 of the buried layer 406 may be 10 microns to 40 microns below the top surface 410 of the substrate 402, and a bottom surface 414 of the buried layer 406 may be 20 microns to 40 microns below the top surface 412 of the buried layer 406. The n-type buried layer 406 may be formed as described in the commonly assigned patent application having patent application Ser. No. 14/555,330, filed concurrently with this application, and which is incorporated herein by reference.

One or more very high aspect ratio contacts 416 are disposed in the substrate 402. The very high aspect ratio contact 416 includes a deep trench 418 which extends at least 10 microns deep in the substrate 402, through the buried layer 406 and into the base semiconductor layer 404. A dielectric liner 422 is disposed on sidewalls of the deep trench 418. The dielectric liner 422 is removed at a bottom of the deep trench 418 in a contact opening 428 which exposes the substrate 402. A doped contact region 432 is disposed in the substrate 402 under the contact opening 428. The very high aspect ratio contacts 416 may be formed as described in any of the examples herein.

A deep trench contact material 434 which is electrically conductive is disposed in the very high aspect ratio contact 416 on the dielectric liner 422, extending through the contact opening 428 and making an electrical connection to the substrate 402, through the doped contact region 432. In the instant example, the deep trench contact material 434 includes a first layer of polysilicon 460 disposed on the dielectric liner 422, extending through the contact openings 428 of the very high aspect ratio contacts 416, and a second layer of polysilicon 462 is disposed on the first layer of polysilicon 460. Dopants are distributed in the first layer of polysilicon 460 and the second layer of polysilicon 462 with an average doping density of at least $1 \times 10^{18}$ cm$^{-3}$. The deep trench contact material 434 may be formed as described in the commonly assigned patent application having patent application Ser. No. 14/555,300, filed concurrently with this application, and which is incorporated herein by reference.

N-type self-aligned sinkers 464 are disposed in the upper semiconductor layer 408 abutting the deep trenches 418 and extending to the buried layer 406. The self-aligned sinkers 464 provide electrical connections to the buried layer 406. The self-aligned sinkers 464 may be formed as described in the commonly assigned patent application having patent application Ser. No. 14/555,209, filed concurrently with this application, and which is incorporated herein by reference.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
a substrate comprising a semiconductor material a p-type base layer, a localized n-type buried layer over a portion of the base layer and a p-type upper layer over the localized n-type buried layer, a top surface of the n-type buried layer being 5 microns to 10 microns below the top surface of the substrate;
a very high aspect ratio contact extending into the localized n-type buried layer and into but not through the p-type base layer, comprising:
a deep trench at least 10 microns deep in the substrate;
a dielectric liner disposed on sidewalls of the deep trench, the very high aspect ratio contact being free of the dielectric liner in a contact opening at a bottom of the deep trench; and
a deep trench contact material, which is electrically conductive, disposed on the dielectric liner and extending into the localized n-type buried layer but not to the p-type base layer.

2. A semiconductor device, comprising:
a substrate comprising a p-type base layer, an n-type buried layer over the p-type base layer and a p-type upper layer over the buried layer, a top surface of the n-type buried layer being 5 microns to 10 microns below the top surface of the substrate;
a very high aspect ratio contact extending through the n-type buried layer and into but not through the p-type base layer, comprising:
a deep trench at least 10 microns deep in the substrate, the deep trench having a width of 1.5 microns to 5 microns proximate to a top surface of the substrate;
a dielectric liner 250 nanometers to 750 nanometers thick disposed on sidewalls of the deep trench, the very high aspect ratio contact being free of the dielectric liner in a contact opening at a bottom of the deep trench, the contact opening having a width of 200 nanometers to 1 micron; and
a deep trench contact material, which is electrically conductive, disposed on the dielectric liner and extending through the contact opening to make an electrical connection to the substrate.

3. The semiconductor device of claim 2, wherein the dielectric liner comprises a first dielectric sub-layer on the sidewalls and a second dielectric sub-layer on the first dielectric sub-layer.

4. The semiconductor device of claim 3, wherein the first dielectric sub-layer comprises thermal oxide 200 nanometers to 300 nanometers thick and the second dielectric sub-layer comprises deposited silicon dioxide 300 nanometers to 500 nanometers thick.

5. The semiconductor device of claim 2, comprising a doped contact region in the substrate below the contact opening, the doped contact region having an average doping density greater than $1 \times 10^{19}$ cm$^{-3}$.

6. The semiconductor device of claim 2, wherein the deep trench contact material comprises polysilicon.

7. The semiconductor device of claim 2, wherein the deep trench has a depth of 25 microns to 35 microns in the substrate.

8. The semiconductor device of claim 2, wherein the very high aspect ratio contact has an aspect ratio greater than 20, the aspect ratio being a ratio of a depth of the deep trench to the width of the deep trench proximate to the top surface of the substrate.

9. The semiconductor device of claim 2, wherein the very high aspect ratio contact has a closed-loop configuration.

10. A method of forming a semiconductor device, comprising the steps:
providing a substrate comprising a base layer, a n-type buried layer over the base layer and an upper layer over the n-type buried layer;
forming a deep trench in the substrate, the deep trench being at least 10 microns deep in the substrate and having a width of 1.5 microns to 5 microns proximate to a top surface of the substrate;
forming a dielectric liner 250 nanometers to 750 nanometers thick on sidewalls and a bottom of the deep trench;
removing the dielectric liner at the bottom of the deep trench from a top of the trench to form a contact opening 200 nanometers to 1 micron wide which exposes the substrate below the deep trench, leaving the dielectric liner on the sidewalls, the semiconductor device being free of an etch mask containing photoresist while the contact openings are formed; and
forming a deep trench contact material, which is electrically conductive, on the dielectric liner and extending through the contact opening to make an electrical connection to the substrate.

11. The method of claim 10, wherein forming the dielectric liner comprises forming a first dielectric sub-layer on the sidewalls and subsequently forming a second dielectric sub-layer on the first dielectric sub-layer.

12. The method of claim 11, wherein forming the first dielectric sub-layer comprises forming a layer of thermal oxide 200 nanometers to 300 nanometers thick and forming the second dielectric sub-layer comprises forming a layer of silicon dioxide 300 nanometers to 500 nanometers thick by a sub-atmospheric chemical vapor deposition (SACVD) process.

13. The method of claim 12, wherein the deep trench contact material comprises polysilicon.

14. The method of claim 10, wherein providing the substrate comprises:
providing the base layer comprising p-type semiconductor material;
implanting n-type dopants into the base layer; and
forming the upper layer comprising p-type semiconductor material by an epitaxial process so that the n-type dopants diffuse to form the n-type buried layer over the base layer, such that a top surface of the n-type buried layer is 5 microns to 10 microns below the top surface of the substrate, and the very high aspect ratio contact extends through the n-type buried layer into the p-type base layer.

15. The method of claim 10, wherein removing the dielectric liner at the bottom of the deep trench comprises a reactive ion etch (RIE) process using a fluorocarbon with at least 4 carbon atoms, and oxygen ($O_2$), and substantially no shorter chain hydrocarbon reactants.

16. The method of claim 15, wherein the fluorocarbon with at least 4 carbon atoms is $C_4F_8$.

17. The method of claim 10, comprising implanting dopants into the substrate at the bottom of the deep trench after the contact opening is formed to form a contact region with an average doping density greater than $1 \times 10^{19}$ cm$^{-3}$, wherein the semiconductor device is free of an implant mask comprising photoresist while the dopants are implanted.

18. The method of claim 10, wherein the deep trench has a depth of 25 microns to 35 microns in the substrate.

19. The method of claim 10, wherein the very high aspect ratio contact has an aspect ratio greater than 20, the aspect ratio being a ratio of a depth of the deep trench to the width of the deep trench proximate to the top surface of the substrate.

20. A method of forming a semiconductor device, comprising the steps:
    providing a substrate comprising a semiconductor material by
        providing a base layer comprising p-type semiconductor material;
        implanting n-type dopants into the base layer; and
        forming an upper layer comprising p-type semiconductor material by an epitaxial process so that the n-type dopants diffuse to form an n-type buried layer over the base layer, such that a top surface of the n-type buried layer is 5 microns to 10 microns below the top surface of the substrate;
    forming a deep trench in the substrate, the deep trench extending through the upper layer and the n-type buried layer into the p-type base layer;
    forming a dielectric liner on sidewalls and a bottom of the deep trench;
    removing the dielectric liner at the bottom of the deep trench using a reactive ion etch (RIE) process with a fluorocarbon having at least 4 carbon atoms, and oxygen ($O_2$), and substantially no shorter chain hydrocarbon reactants from a top of the trench to form a contact opening which exposes the substrate below the deep trench, leaving the dielectric liner on the sidewalls, the semiconductor device being free of an etch mask containing photoresist while the contact openings are formed; and
    forming a deep trench contact material, which is electrically conductive, on the dielectric liner and extending through the contact opening to make an electrical connection to the substrate.

21. The method of claim 20, wherein the fluorocarbon with at least 4 carbon atoms is $C_4F_8$.

22. The method of claim 20, comprising implanting dopants into the substrate at the bottom of the deep trench after the contact opening is formed to form a contact region, wherein the semiconductor device is free of an implant mask comprising photoresist while the dopants are implanted.

* * * * *